United States Patent
Lee et al.

(10) Patent No.: US 8,674,436 B2
(45) Date of Patent: Mar. 18, 2014

(54) LATERAL DOUBLE DIFFUSION METAL-OXIDE SEMICONDUCTOR DEVICE AND METHOD FOR MANUFACTURING THE SAME

(75) Inventors: Jong Seok Lee, Gyeonggi-do (KR); Kyoung Kook Hong, Gyeonggi-do (KR)

(73) Assignee: Hyundai Motor Company, Seoul (KR)

( * ) Notice: Subject to any disclaimer, the term of this patent is extended or adjusted under 35 U.S.C. 154(b) by 73 days.

(21) Appl. No.: 13/406,726

(22) Filed: Feb. 28, 2012

(65) Prior Publication Data

US 2013/0126969 A1 May 23, 2013

(30) Foreign Application Priority Data

Nov. 22, 2011 (KR) ........................ 10-2011-0122075

(51) Int. Cl.
*H01L 29/78* (2006.01)
*H01L 29/06* (2006.01)

(52) U.S. Cl.
USPC ..... 257/335; 257/339; 257/343; 257/E29.256

(58) Field of Classification Search
USPC .................................................. 257/339, 343
See application file for complete search history.

(56) References Cited

U.S. PATENT DOCUMENTS

| 6,825,531 | B1 | 11/2004 | Mallikarjunaswamy | |
|---|---|---|---|---|
| 7,180,158 | B2 | 2/2007 | Khemka et al. | |
| 2011/0057263 | A1* | 3/2011 | Tang et al. | 257/339 |
| 2011/0241114 | A1* | 10/2011 | Su et al. | 257/343 |

FOREIGN PATENT DOCUMENTS

| JP | 2010245369 A | 10/2010 |
|---|---|---|
| KR | 10-1015529 | 4/2010 |
| KR | 10-2010-0067567 | 6/2010 |
| KR | 10-2011-0037031 | 4/2011 |
| KR | 10-2011-0078621 | 7/2011 |

\* cited by examiner

*Primary Examiner* — Matthew W Such
*Assistant Examiner* — David Spalla
(74) *Attorney, Agent, or Firm* — Edwards Wildman Palmer LLP; Peter F. Corless

(57) ABSTRACT

Disclosed is an LDMOS device, which is configured to reduce an electric field concentrated to a gate oxide film and lower an ON-resistance produced when the device conducts a forward action, and a method for manufacturing the same. More specifically, when an n-drift region is formed on a P-type substrate, a p-body is formed on the n-drift region through an epitaxial process, and then the p-body region is partially etched to form a plurality of p-epitaxial layers, so that when the device executes an action for blocking a reverse voltage, depletion layers are formed between the junction surfaces of the p-epitaxial layers and the n-drift region including the junction surfaces between the n-drift region and the p-body.

5 Claims, 4 Drawing Sheets

LATERAL DOUBLE DIFFUSION METAL-OXIDE SEMICONDUCTOR DEVICE AND METHOD FOR MANUFACTURING THE SAME

CROSS-REFERENCE TO RELATED APPLICATION

This application claims under 35 U.S.C. §119(a) the benefit of Korean Patent Application No. 10-2011-0122075 filed on Nov. 22, 2011, the entire contents of which are incorporated herein by reference.

BACKGROUND (a) Technical Field

The present invention relates to a Lateral Double Diffusion Metal-Semiconductor (LDMOS) device, and a method for manufacturing the same. More particularly, the present invention relates to an LDMOS device, which is configured to reduce an electric field concentrated to a gate oxide film, and lower ON-resistance produced when the device conducts a forward action, and a method for manufacturing the same.

(b) Background Art

Recently, as devices and application appliances employing one or more power semiconductor devices tend to become bigger and larger in terms of size and capacitance, there has been high demand for power semiconductor devices, such as an Insulated Gate Bipolar Transistor (IGBT) or a Metal-Oxide-Semiconductor Field Effect Transistor (MOSFET). Further, there has been also a high demand for high efficiency power semiconductor devices.

Among the above-mentioned power semiconductor devices, an LDMOS type power device applicable to an integrated circuit has a channel region of an existing MOS device, and a low-concentration drift region durable against a high breakdown voltage. In particular, since a high voltage up to several hundred volts may be applied to a drain when the LDMOS type power device is operated, the drift region should maintain a high breakdown voltage, and an ON-voltage between the channel region and the drain should be low. Therefore, in order to obtain a high breakdown voltage at the drift region and a low ON-resistance, devices to with a Reduced SURface Field (RESURF) structure are developed, in which the RESURF structure is capable of reducing the surface field.

Conventional power devices with the RESURF structure involve devices with a source field plate structure, in which a source electrode extends from the source region to a part of the drift region, devices with a gate field plate structure, in which a source electrode extends from the gate region to a part of the drift region, and devices with a structure, in which p-type impurities are implanted into the surface of an n-type drift region. However, the above-mentioned conventional power devices cannot realize both of the high breakdown voltage and low ON-resistance.

An LDMOS transistor, which is a high voltage power device, has rapid switching velocity, high input impedance, low power consumption, compatibility with a Complementary Metal-Oxide-Semiconductor (CMOS) process, etc., and are widely employed in display drive Integrated Circuits (ICs), power converters, motor controllers, automotive power supplies, etc. In such a power device, specific ON-resistance and breakdown voltage are critical factors, by which the performance of the device is greatly influenced. As such, various technologies have been proposed for increasing the breakdown voltage while maintaining the ON-resistance.

FIG. 6 is a cross-sectional view showing a conventional LDMOS transistor structure. In FIG. 6, the LDMOS transistor includes, in a P-type substrate 100, a deep n-drift region 102 used as a drift region of the LDMOS transistor, a p-body 104, on the top of which a channel of the LDMOS transistor will be formed, an $n^+$ source 106 and drain 108, a $p^+$ source 110 for to body contact, a field oxide film 112 with a LOCal Oxidation of Silicon (LOCOS) structure, a gate oxide film 114, a drain electrode 116, and a source electrode 118.

In such a conventional LDMOS transistor, the length ($L_D$) and doping concentration of the n-drift region are important factors for determining the ON-resistance and breakdown voltage of the device. That is, as the length of the n-drift region, $L_D$, indicated by arrow in FIG. 6 increases, the breakdown voltage increases and the ON-resistance also increases, and as the concentration of the drift region increases, the ON-resistance decreases and the breakdown voltage also decreases. In other words, the length and concentration of the drift region have a trade-off relationship. As a result, with such a conventional LDMOS transistor structure, it is difficult to increase the breakdown voltage without increasing the ON-resistance.

Many reports have indicated that the breakdown voltage can be improved by forming a trench filled with an oxide instead of LOCal Oxidation of Silicon (LOCOS) as the field oxide film in the drift region of the LDMOS transistor. As an example, LDMOS transistors have been developed which exhibit an improved breakdown voltage without increasing the ON-resistance by forming a trench through etching of a silicon trench, gap-fill of an oxide film, and Chemical Mechanical Polishing (CMP) in the drift region of an LDMOS transistor instead of LOCOS (Won-So Son, Young-Ho Sohn and Sie-young Choi, "SOI RESURF LDMOS transistor using trench filled with oxide", Electronics Letters, Vol. 39, pp. 1760-1761 (2003)).

However, due to the rather complicated steps involved in the above process, such as CMP, required for forming such a trench structure, the entire process becomes more complicated an expensive that most in the industry would desire.

SUMMARY OF THE DISCLOSURE

The present invention provides an LDMOS device with a new structure, wherein in a state in which an n-drift region is formed on a P-type substrate, a p-body is formed on the n-drift region through an epitaxial process. Then, the p-body region is partially etched to form a plurality of p-epitaxial layers, so that when the device executes an action for blocking a reverse voltage, depletion layers are formed between the junction surfaces of the p-epitaxial layers and the n-drift region including the junction surfaces between the n-drift region and the p-body. Another aspect of the present invention is to provide a method for manufacturing such an LDMOS device.

In one aspect, the present invention provides a lateral double diffusion metal-oxide semiconductor device including: an n-drift region formed on a P-type substrate; a p-body formed at one side of the top of the n-drift region; a plurality of p-epitaxial layers formed at the other side of the top of the n-drift region; an $n^+$ source and a $p^+$ source formed by implanting N-type and P-type ions to the p-body; an $n^+$ drain formed on the n-drift region at the one side of the epitaxial layers; a field oxide film formed in a space between one end of the p-body and one end of each of the p-epitaxial layers, and formed to encapsulate each of the p-epitaxial layers; a gate oxide film formed in a trench part of the field oxide film; a source electrode formed on the $n^+$ source and the $p^+$ source; and a drain electrode formed on the $n^+$ drain.

In another aspect, the present invention provides a method for manufacturing a lateral double diffusion metal-oxide semiconductor device including: forming a p-body on an n-drift region through an epitaxial process in a state in which the n-drift region is formed on a P-type substrate; forming a plurality of p-epitaxial layers arranged in a "comb" shape together with the p-body by partially etching the p-body; forming a source region including an n+ source and a p+ source by implanting N-type and P-type ions to the p-body, and forming a drain region including an n+ drain on the n-drift region by implanting N-type and P-type ions to the n-drift region; and forming a field oxide film in a space between one end of the p-body and one end of each of the p-epitaxial layers, and forming a gate oxide film in a trench part of the field oxide film.

Advantageously, when an n-drift region is formed on a P-type substrate, a p-body is epitaxially formed on the n-drift region, and then the p-body region is partially etched to form a plurality of p-epitaxial layers, so that when the semiconductor device in the illustrative embodiment of the present invention performs a reverse voltage blocking operation, one or more depletion layers are formed between the junction surfaces of the p-epitaxial layers and the n-drift region, as well as between the junction surfaces of the n-drift region and the p-body. As a result, it is possible to reduce an electric field concentrated to a gate oxide film while at the same time decreasing the complexity of the operation.

In addition, since it is possible to increase the doping concentration of the n-drift region, to the illustrative embodiment of the present invention also lowers an ON-resistance produced when the inventive semiconductor device performs a forward operation.

BRIEF DESCRIPTION OF THE DRAWINGS

The above and other features of the present invention will now be described in detail with reference to certain exemplary embodiments thereof illustrated in the accompanying drawings which are given hereinbelow by way of illustration only, and thus are not limitative of the present invention, and wherein.

DETAILED DESCRIPTION

Hereinafter reference will now be made in detail to various embodiments of the present invention, examples of which are illustrated in the accompanying drawings and to described below.

Figure 5:
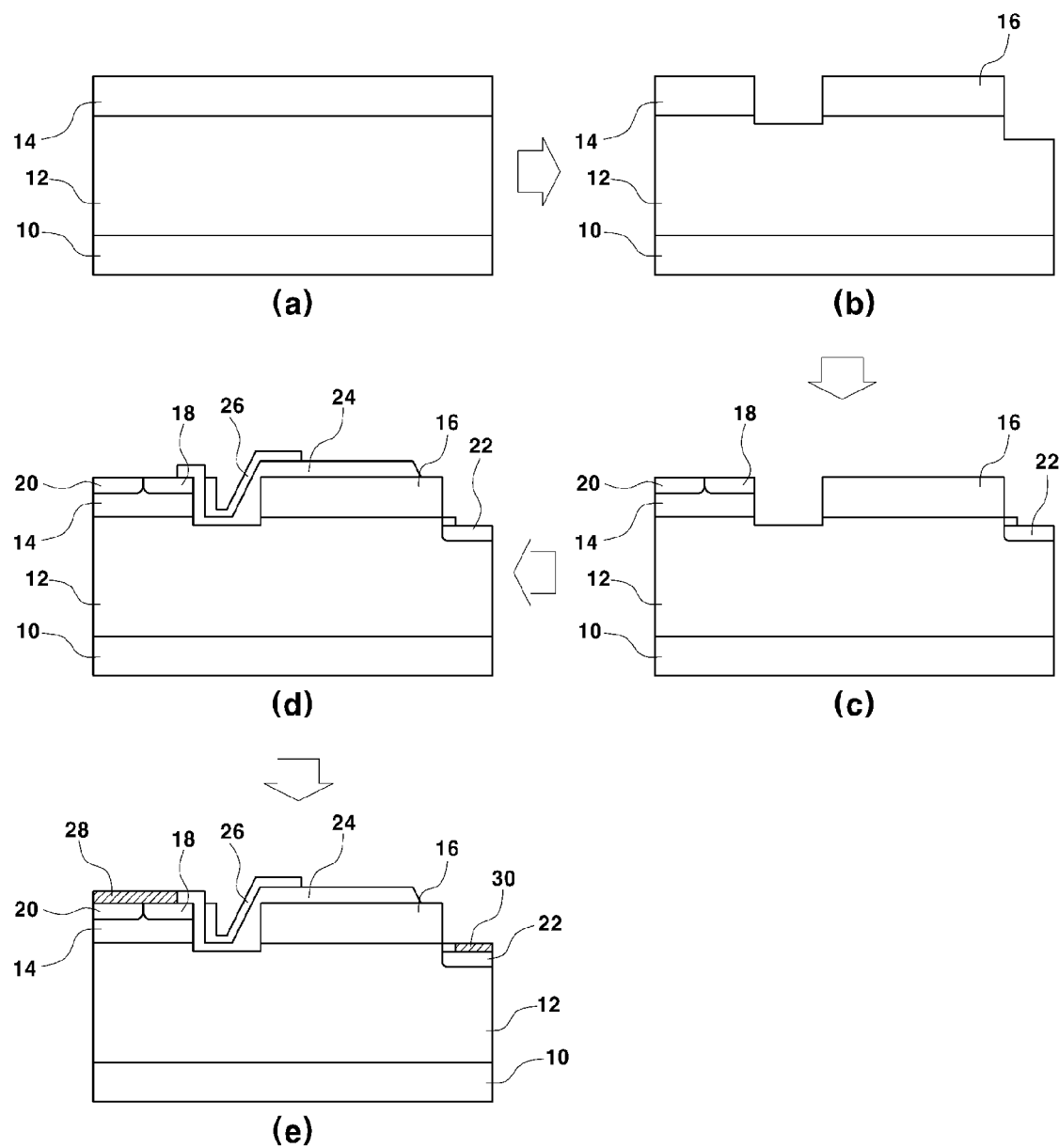
FIG. 5 is a cross-sectional view showing a process for manufacturing the inventive LDMOS device.
Figure 6:
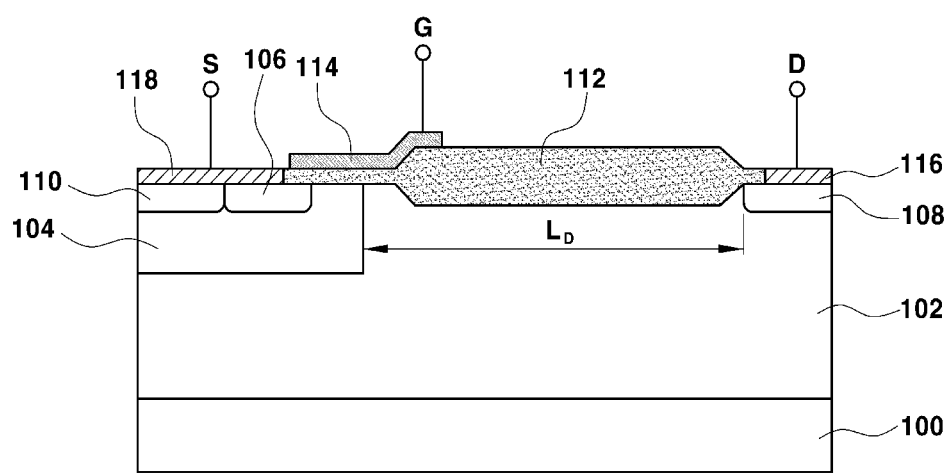
FIG. 6 is a cross-sectional view showing a conventional LDMOS transistor structure.

First, a method for manufacturing a silicon carbide lateral MOSFET device will be described with reference to FIG. 5 to help the understanding of the present invention. When an n-drift region used as a drift region is formed on a single crystal semiconductor substrate, i.e., a P-type substrate 10, a p-body 14 is epitaxially formed on the n-drift region 12 (see FIG. 5a). Next, the p-body 14 is etched in a comb shape using a conventional etching process to form a plurality of p-epitaxial layers 16 in the p-body 14. The p-body 14 and the p-epitaxial layers 16 are spaced apart from each other in the widthwise direction, and the p-epitaxial layers 16 are spaced apart from each other in the longitudinal direction (see FIGS. 1 and 5b).

Figure 1:
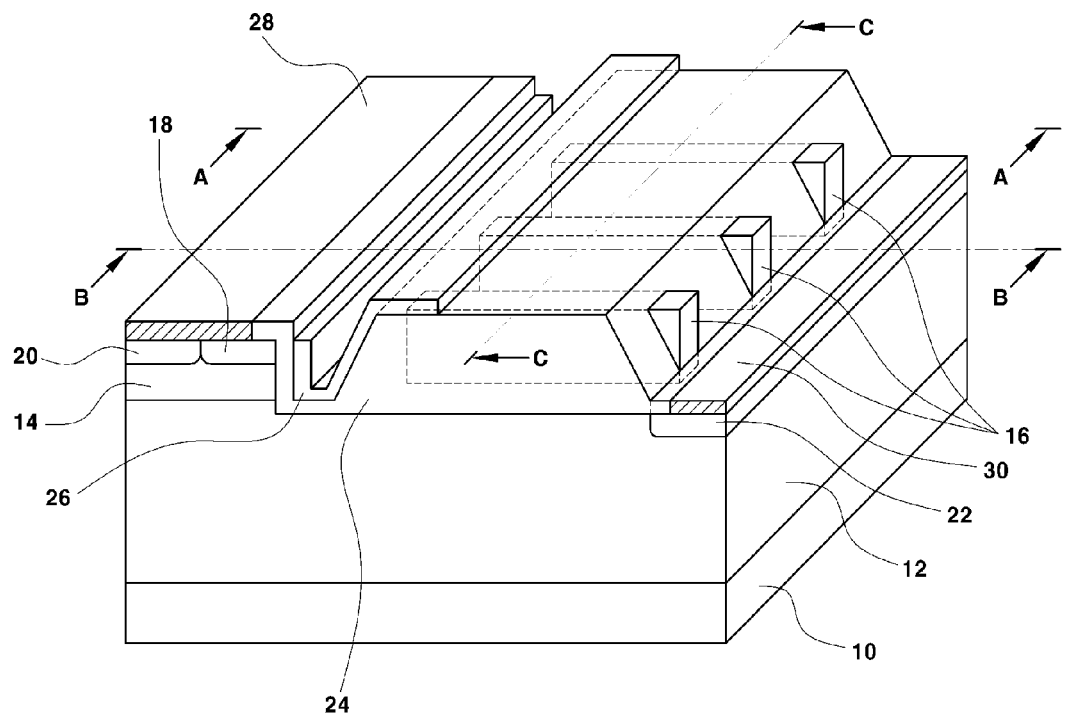
FIG. 1 is a perspective view showing the inventive LDMOS device.

Next, N-type and P-type ions are implanted to the p-body 14 using an ion implantation mask, thereby forming a source region including an n+ source 18 and a p+ source 20, and at the same time, N-type and P-type ions are implanted to the n-drift region 12 exposed at a side of the epitaxial layers 16, thereby forming a drain region including an n+ drain (see FIGS. 1 and 5c).

Subsequently, a field oxide film 24 is formed over the entire surface except for a part of the top surface and a lateral surface of the n+ source 18, a lateral surface of the p-body 14, the entire exposed surface of the n-drift region 12, and an end of each of the p-epitaxial layers 16, and a gate oxide film 26 is formed over the trench part and a part of the top surface of the field oxide film 24 (see FIGS. 1 and 5d). Through subsequent processes well-known in the art, a source electrode 28 is formed on the n+ source 18 and p+ source 20, and a drain electrode 30 is formed on the n+ drain, whereby the lateral MOSFET device of the illustrative embodiment of the present invention is completed (see FIGS. 1 and 5e).

Now, features and forming steps of individual components of the inventive MOSFET device manufactured in the above-mentioned order will be described in more detail with reference to FIGS. 1 to 4. Unlike the existing method in which a trench filled with an oxide instead of LOCOS as a field oxide is formed in an n-drift region in an LDMOS transistor, in the illustrative exemplary MOSFET device, i.e., an LDMOS device, a p-body 14 is formed on an n-drift region 12 using an epitaxial process rather than an existing ion implantation process, and then the p-body 14 is partially etched in such a manner that in addition to the p-body 14, a plurality of epitaxial layers 14 are formed to be spacedly arranged in a comb shape along the longitudinal direction as shown in FIG. 4.

Figure 2:
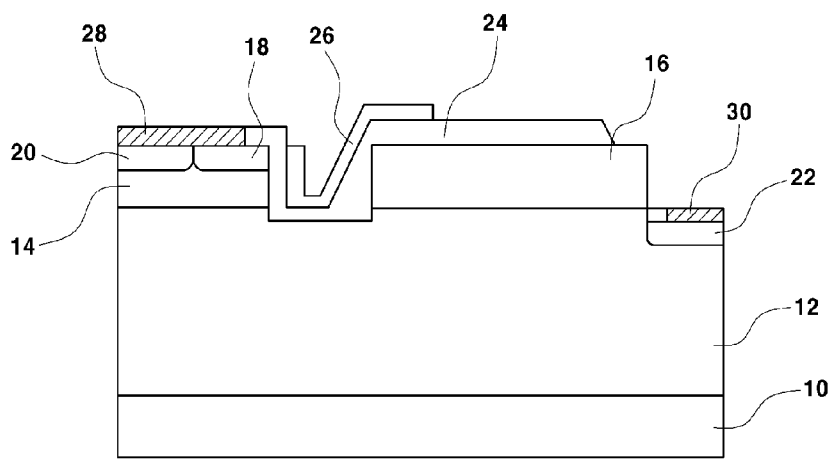
FIG. 2 is a cross-sectional view taken along line A-A in FIG. 1.
Figure 3:
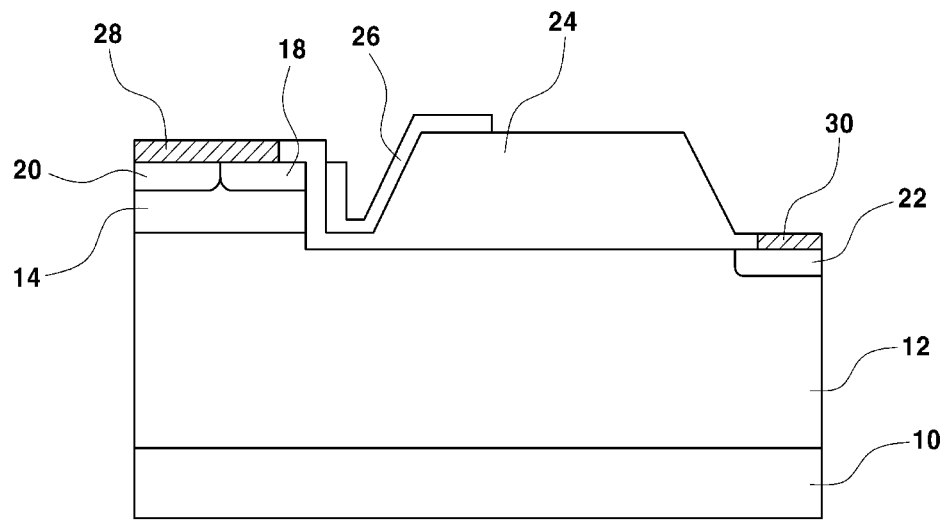
FIG. 3 is a cross-sectional view taken along line B-B in FIG. 1.
Figure 4:
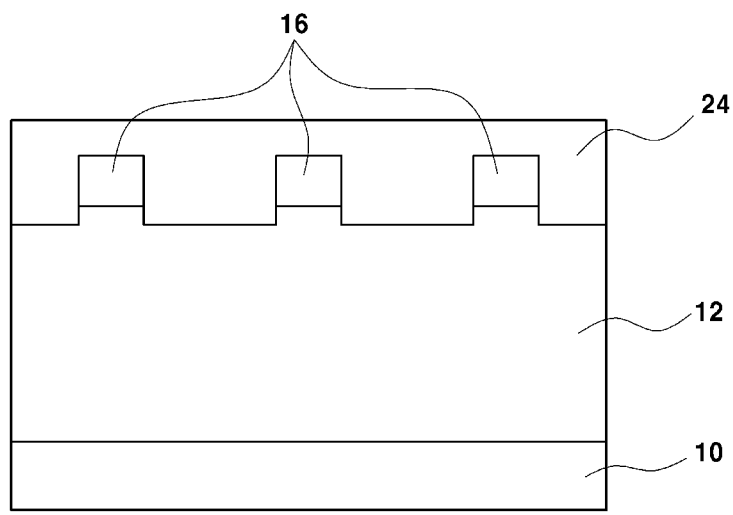
FIG. 4 is a cross-sectional view taken along line C-C in FIG. 1.

In addition, as shown in FIGS. 2 and 3, after the p-epitaxial layers 16 are formed, a source region including an n+ source 18 and a p+ source are formed on the p-body 14 by the implantation of N-type and P-type ions, and a drain region including an n+ drain 22 is formed on the n-drift region 12 exposed at one side of the p-epitaxial layers 16 by the implantation of N-type and P-type ions.

At this time, in the process of etching a part of the p-body 14, the top of the n-drift region 12 is partially etched to form a channel which is deeper than the sum of the height of one side of the p-body 14 and the height of one side of the n+ source 18, and deeper than the height of the p-epitaxial layers 16, so that a gate electrode including a field oxide film 24 and a gate oxide film 26 can be easily formed in the channel. The gate oxide film may be formed from polysilicon.

In particular, as a plurality of p-epitaxial layers joined with the n-drift region 12 are formed in a comb shape arrangement along the longitudinal direction between the source region and the drain region by etching a part of the p-body 14 as described above. One or more depletion layers are formed between the junction surfaces of the p-epitaxial layers 16, each of which is a P-type semiconductor epitaxial layer, and the n-drift region 12, which is a N-type semiconductor epitaxial layer, when the reverse voltage of the device is blocked.

Furthermore, in addition to the depletion layers formed between the junction surfaces of the p-type epitaxial layers 16 and the n-drift layer 12, one or more depletion layer are also produced between the junction surfaces of the P-type substrate 10 and the n-drift region 12, which is an N-type semiconductor epitaxial layer. Further, in the field dielectric layer, i.e. between the field oxide film 24 and the n-drift region 12, which is an N-type semiconductor epitaxial layer, a dielectric RESURF occurs, and between the n-drift region 12 and the P-type substrate 10, a super-junction structure is formed.

Accordingly, since the n-drift region 12 will entirely form the depletion layer when the n-drift region 12 has a high doping concentration, it is possible to obtain a high breakdown voltage, and by the n-drift region 12 with a high doping concentration, it is possible to lower the ON-resistance at the same time.

At this time, assuming that the thickness of the n-drift region 12 is $t_v$ and the doping concentration is $N_{drift}$, the total quantity of electric charge of the n-drift region can be calculated using Equation 1 as follows.

$$Q_n = t_n \times N_{drift} \quad (1)$$

Preferably, the thickness and doping concentration of the n-drift region should be properly selected and the total quantity of electric charge should be well controlled in order to form the entirety of the n-drift region 12 as a depletion layer, thereby maximizing the breakdown voltage by the super-junction and the RESURF effect.

The invention has been described in detail with reference to exemplary embodiments thereof. However, it will be appreciated by those skilled in the art that changes may be made in these embodiments without departing from the principles and spirit of the invention, the scope of which is defined in the appended claims and their equivalents.

What is claimed is:

1. A lateral double diffusion metal-oxide semiconductor device comprising:
   an n-drift region formed on a P-type substrate;
   a first portion of a p-body formed at one side of the top of the n-drift region;
   a plurality of p-epitaxial layers formed with a second portion of the p-body which is partially etched at the other side of the top surface of the n-drift region;
   an $n^+$ source and a $p^+$ source formed by implanting N-type and P-type ions to the p-body;
   an $n^+$ drain formed on the n-drift region at the one side of the epitaxial layers;
   a field oxide film formed in a space between one end of the p-body and one end of each of the p-epitaxial layers, and formed to encapsulate each of the p-epitaxial layers;
   a gate oxide film formed in a trench part of the field oxide film;
   a source electrode formed on the $n^+$ source and the $p^+$ source; and
   a drain electrode formed on the $n^+$ drain.

2. The device of claim 1, wherein the p-epitaxial layers are spacedly arranged in a comb shape along a longitudinal direction perpendicular to the p-body.

3. The device of claim 1, wherein the field oxide film is formed over the entire surface except for a portion of the top surface and one side surface of the n+ source, one side surface of the p-body, an exposed surface of the n-drift region, and one end of each of the p-epitaxial layers.

4. The device of claim 1, wherein depletion layers are formed between junction surfaces of the p-epitaxial layers and the n-drift region including junction surfaces between the n-drift region and the p-body.

5. The device of claim 1, wherein the n-drift region is provided at the top portion thereof with a channel which is deeper than the sum of the height of one side of the p-body and the height of one side of the n+ source, and deeper than the height of the p-epitaxial layers.

* * * * *